United States Patent [19]
Shafer

[11] Patent Number: 6,005,499
[45] Date of Patent: Dec. 21, 1999

[54] SYSTEMS AND METHODS FOR GENERATING KEY PRESS STATUS MESSAGES WITHIN TELECOMMUNICATIONS SYSTEMS OR OTHER NETWORKS

[75] Inventor: Kirk E. Shafer, Mission Viejo, Calif.

[73] Assignee: Toshiba America Information Systems, Inc., Irvine, Calif.

[21] Appl. No.: 08/897,202

[22] Filed: Jul. 21, 1997

[51] Int. Cl.[6] .................................................. H03K 17/94
[52] U.S. Cl. .......................... 341/34; 341/20; 379/368; 455/550; 375/247
[58] Field of Search .......................... 341/20, 22, 32–34, 341/26; 345/168, 169; 379/361, 368; 455/550, 575, 403; 375/242, 244, 247, 248

[56] References Cited

U.S. PATENT DOCUMENTS

| | | | |
|---|---|---|---|
| 4,467,140 | 8/1984 | Fathauer et al. | 455/550 |
| 4,583,189 | 4/1986 | Koyama | 341/26 |
| 5,220,601 | 6/1993 | Gulick et al. | 379/368 |
| 5,235,635 | 8/1993 | Gulick | 379/368 |
| 5,619,196 | 4/1997 | Escobosa | 341/26 |
| 5,798,716 | 8/1998 | Davis | 341/26 |
| 5,848,353 | 12/1998 | Matsumoto | 455/575 |

*Primary Examiner*—Michael Horabik
*Assistant Examiner*—Timothy Edwards, Jr.
*Attorney, Agent, or Firm*—Lyon & Lyon LLP

[57] ABSTRACT

Systems and method for monitoring and generating key pad status messages in a telecommunications network. A resistor ladder network is provided to generate distinct DC-level analog voltage signals in response to the pressing of any one of a plurality to keys of a key pad. A combiner circuit is employed to combine the DC-level analog voltage signals with an analog voice signal received from an audio transducer to form a composite analog signal, and a coder/decoder circuit is provided to convert the composite analog signal into a composite digital signal. A digital signal processing circuit executes a subtractive sample delta filtering algorithm to determine whether data indicative of a key press is included within the composite digital signal, and generates status messages indicative of a key press upon determining that a key has been pressed.

20 Claims, 1 Drawing Sheet

SYSTEMS AND METHODS FOR GENERATING KEY PRESS STATUS MESSAGES WITHIN TELECOMMUNICATIONS SYSTEMS OR OTHER NETWORKS

BACKGROUND OF THE INVENTION

The field of the present invention is telecommunications systems and, more particularly, systems and methods for generating and transmitting key press status messages within telecommunications systems and/or networks.

Recently, substantial attention has been directed toward the field of digital telecommunications systems and, in particular, toward the development of digital wireless telecommunications systems. To obtain and transmit key press status information conventional telecommunications systems generally employ a microprocessor and associated firmware to continuously monitor a key pad grid to detect when a key on an associated key pad has been depressed. Upon detecting a key press, the microprocessor generates a key press status message and, in many instances, causes a dual tone multifrequency (DTMF) signal to be delivered to an associated coder/decoder (CODEC) circuit. The analog DTMF signal is then converted by the CODEC circuit to a digital signal for transmission within a frame of data to be transmitted over the communications network. The key press status information is provided by the microprocessor to a digital signal processing unit that arranges, for example, digital voice, status or control data, and sync data to be transmitted within each frame.

Those skilled in the art will appreciate that the provision of a microprocessor in a handset solely for the purpose of monitoring a key pad grid and generating status messages upon the detection of a key press adds substantially to the cost of a handset. In addition, the provision of such a processor in cellular or wireless handsets adds substantially to the mass of circuitry provided in the handset.

Thus, it is believed that those skilled in the art would find a system and method for monitoring and detecting key press status without the use of a dedicated microprocessor to be quite useful.

SUMMARY OF THE INVENTION

The present invention is directed to improved systems and methods for monitoring and detecting key press status. In one particularly innovative embodiment, the key press status detection function is performed externally of a telephone handset. A resistor ladder network is provided in the telephone handset to generate unique DC-level analog voltages for each key that may be depressed on the handset. The generated key press voltages are preferably provided to a voltage combiner circuit which generates an analog signal output comprising both DC-level voltages associated with key presses and analog voice data. The signal generated by the voltage combiner circuit is provided to a coder/decoder (CODEC) device that converts the analog signal to a digital format. The digital voice and key press data may then be transmitted in a conventional fashion over a telecommunications network. The digital voice and key press data may be provided to a downline microprocessor and separated for further transmission. In such an embodiment, key press status may be determined via subtractive sample-delta filtering. In short, frames of digital voice and key press data may be applied to a subtractive sample-delta filter which increments a counter variable each time a digital sample absolute value differential is below a predetermined threshold level. If the differential value is greater than the threshold level, then the counter is reset to zero. Once the counter reaches a predetermined count indicating that a constant non-voice DC sample has been present for the requisite period of time, it may be determined that a key press has occurred. Further, the level of the samples within the predetermined period of time may be used to identify which key has been pressed.

Thus, it will be apparent to those skilled in the art that the systems and methods of the present invention provide a cost effective means for detecting key press status and reducing the amount of circuitry generally provided in a telephone handset.

Accordingly, it is an object of the present invention to provide improved systems and methods for detecting key press status within a telecommunications system.

DETAILED DESCRIPTION OF THE PREFERRED EMBODIMENTS

Figure 1:
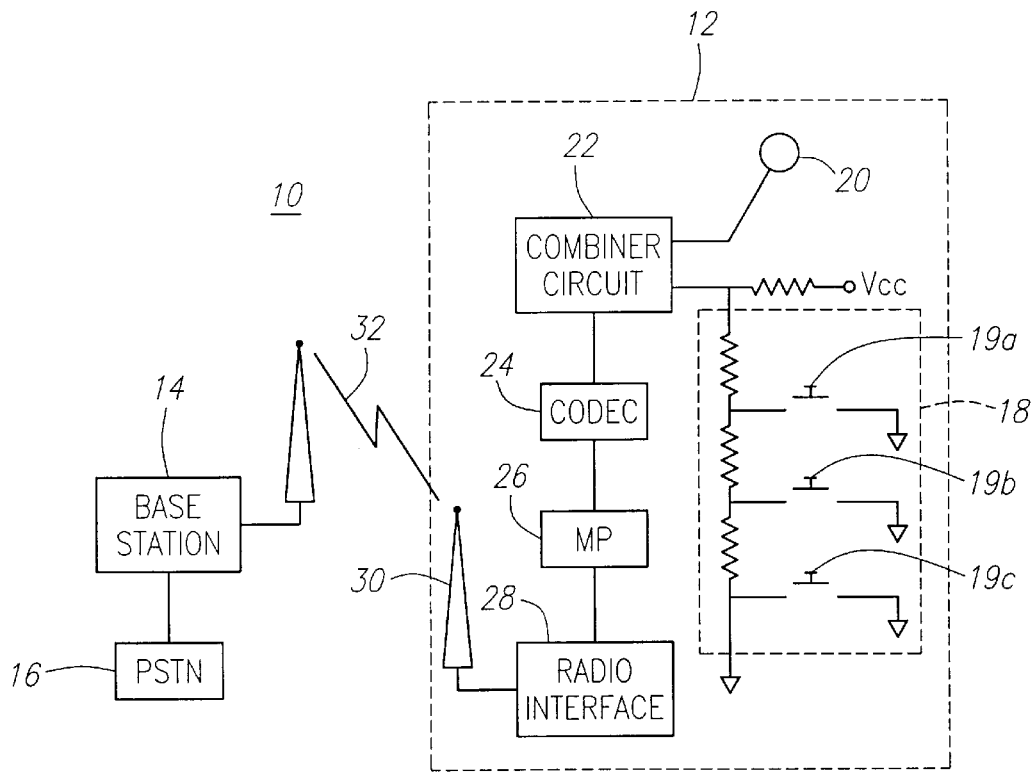
FIG. 1 is a block diagram representing a telephone handset and associated backline hardware for detecting key press status in accordance with a first embodiment of the present invention.

Turning now to the drawings, FIG. 1 is a block diagram illustrating a wireless telecommunications system 10 in accordance with one preferred form of the present invention. As shown, the wireless telecommunications system 10 includes a mobile station 12, a base station 14, and a public service telephone network 16. The mobile station 12 has the ability to communicate with the base station 14 via a conventional wireless radio interface, and the base station 14 has the capability to establish communications links with the public service telephone network 16 in a conventional fashion.

In one particularly innovative aspect, the mobile station 12 includes a resistor ladder network 18, an audio transducer 20, a combiner circuit 22, a coder/decoder (CODEC) circuit 24, a microprocessor 26, a radio interface circuit 28, and an antenna 30. The resistor ladder network 18 generates unique DC-level voltage signals in response to a depression of any one of keys 19a–c. The combiner circuit 22 combines the DC-level voltage signals produced by the resistor ladder network 18 with analog voice signals provided by audio transducer 20 to form a composite analog audio signal, and the CODEC 24 converts the composite analog audio signal to a compressed digital data signal. The CODEC 24 may also perform a framing function under the control of the microprocessor 26, such that properly framed data is provided by the CODEC 24 to the microprocessor 26. Alternatively, the microprocessor 26 may parse the digital audio data signal received from the CODEC 24 into a plurality of digital data frames, and may add sync, status or control data and/or error checking data to the frames. The microprocessor 26 then forwards properly formatted data frames to the radio interface circuit 28 for broadcast by the antenna 30.

Transmissions from the antenna 30 may be received by antenna 32 and provided to digital communications circuitry within the base station 14. The base station 14 may convert the frames of digital data into a format compatible with that utilized by the public service telephone network (PSTN) 16. Similarly, data may be provided by the PSTN 16 to the base station 14 and from there via antenna 32 to the mobile station 12. In this fashion, communications may be established between the mobile station 12 and a telephone connected to the public service telephone network 16.

Importantly, the microprocessor 26 has the ability to implement a subtractive sample-delta filtering algorithm to detect key press status data within the digital audio signal provided by the CODEC 24. Stated somewhat differently, software executed within the microprocessor 26 may continuously track sample deltas of the digital signal received from the CODEC 24 to detect the presence of DC-level voltage signals represented within the digital data. Upon detecting that a DC-level voltage signal is represented within the digital data, the DC level may be determined to determine which of keys 19a–c has been depressed. This information may then be incorporated as status data in the frames of data transferred to the radio interface circuit 28 and from there to the base station 14.

Figure 2:
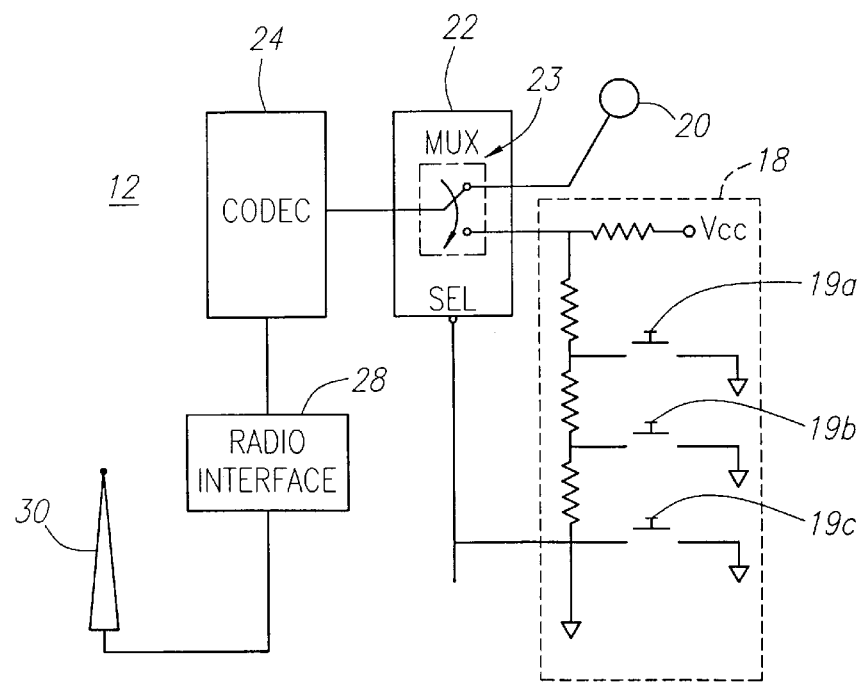
FIG. 2 is a block diagram representing a telephone handset in accordance with a second embodiment of the present invention.

In alternative embodiments, the key press status determination algorithm may be implemented externally of the mobile station 12, for example, within the base station 14 or within other downline components such as base station controller units (not shown). An example of such an embodiment is shown in FIG. 2. Notably, when the key press status determination function is performed externally of the mobile station 12, it may be preferable to forgo entirely the use of a dedicated microprocessor in the mobile unit. For example, as shown in FIG. 2, the combiner circuit 22, illustrated as an analog multiplexer or MUX circuit 23, may provide its output to the CODEC 24, and the CODEC 24 may provide its output directly to the radio interface circuit 28. It will be noted that, where a MUX circuit 23 is employed as the combiner circuit 22, upon each key press the audio transducer 20 will be disconnected from the CODEC 24, and the resistor ladder network 18 will be coupled to the CODEC 24, such that a unique DC voltage level may be provided to the CODEC 24.

Thus, it will be apparent to those skilled in the art that a wireless communications system incorporating an embodiment of the present invention has the ability to monitor key press signals and to generate corresponding status messages without the use of a dedicated microprocessor. Thus, it is believed that substantial savings in both cost and space utilization may be achieved through the use of the key press status monitoring systems and methods disclosed herein.

While the invention is susceptible to various modifications and alternative forms, a specific example thereof has been shown by way of example in the drawing and is herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. A method for detecting key press status within a telecommunications system, said method comprising the steps of:

generating distinct DC analog voltage signals in response to a plurality of key presses;

generating an analog voice signal;

temporally combining said generated DC analog signals with said generated analog voice signal to form an analog composite signal;

converting said analog composite signal to a digital composite signal; and filtering said digital composite signal with a subtractive sample-delta filtering algorithm to detect key press status data within said digital composite signal.

2. The method of claim 1, wherein said filtering step is performed externally of a mobile unit.

3. The method of claim 1, further comprising parsing said digital composite signal into a plurality of digital data frames.

4. The method of claim 1, wherein the detect key press status data is detected by sampling the digital composite signal to obtain digital samples and incrementing a counter variable each time one of the digital samples is below a predetermined threshold value.

5. The method of claim 1, wherein the key presses are identified by sampling the digital composite signal to obtain digital signals, and determining the level of the digital samples within a predetermined period of time.

6. A signal processor for detecting key press status within a telecommunications network, said signal processor comprising:

a processing circuit and an associated memory;

said memory storing a program that, when accessed and executed by said processing circuit, enables said processing circuit to implement a subtractive sample-delta filtering function for detecting key press status data within an acquired frame of digital data.

7. The signal processor of claim 6, wherein said digital signal processor circuit parses said composite digital signal into a plurality of digital data frames.

8. A system for managing key press status data within a telecommunications network, said system comprising:

a circuit network associated with a plurality of key pad keys for generating a plurality of distinct analog DC signals in response to a depression of said plurality of key pad keys;

an audio transducer for generating an analog voice signal;

a multiplexor circuit coupled to said circuit network and said audio transducer for temporally combining said generated analog DC signals with said analog voice signal to produce a composite analog signal;

an analog-to-digital converter circuit for converting said composite analog signal to a composite digital data signal; and a digital signal processing circuit for filtering said composite digital signal with a subtractive sample-delta filtering algorithm to detect key press status data within said composite digital signal.

9. The system of claim 8, wherein said digital signal processing circuit is located external of a mobile unit.

10. The system of claim 8, wherein said circuit network comprises a resistor ladder network.

11. The system of claim 8, wherein said digital signal processing circuit parses said composite digital signal into a plurality of digital data frames.

12. A system for managing key press status data within a telecommunications network, said system comprising:

a circuit network associated with a plurality of key pad keys for generating a plurality of distinct analog DC signals in response to a depression of the plurality of key pad keys;

an audio transducer for generating an analog voice signal;

a multiplexor circuit coupled to said circuit network and said audio transducer for temporally combining said generated analog DC signals with said analog voice signal to produce a composite analog signal;

an analog-to-digital converter circuit for converting said composite analog signal to a composite digital signal; and a digital signal processing circuit for filtering said composite digital signal to detect key press status data within said composite digital signal.

13. The system of claim 12, wherein said circuit network, said analog-to-digital converter, and said digital signal processing circuit are each located within a remote unit.

14. The system of claim 12, wherein said circuit network and said analog-to-digital filter are located within a remote unit and said digital signal processing circuit is located external of said remote unit.

15. The system of claim 12, where in said circuit network comprises a resistor ladder network.

16. The system of claim 12, wherein said digital signal processing circuit parses said composite digital signal into a plurality of digital data frames.

17. A method for detecting key press status within a telecommunications system, said method comprising the steps of:

generating distinct DC analog voltage signals in response to a plurality of key presses;

generating an analog voice signal;

temporally combining said generated DC analog signals with said generated analog voice signal to form an analog composite signal;

converting said analog composite signal to a digital composite signal; and filtering said digital composite signal to detect key press status data within said digital composite signal.

18. The method of claim 17, wherein said filtering step is performed externally of a mobile unit.

19. The method of claim 17, further comprising parsing said digital composite signal into a plurality of digital data frames.

20. The method of claim 17, wherein the detect key press status data is detected by sampling the digital composite signal to obtain digital samples and incrementing a counter variable each time one of the digital samples is below a predetermined threshold value.

* * * * *